United States Patent [19]

Chu

[11] Patent Number: 5,059,786
[45] Date of Patent: Oct. 22, 1991

[54] MULTI-COLOR COINCIDENT INFRARED DETECTOR

[75] Inventor: Tak-Kin Chu, Bethesda, Md.

[73] Assignee: The United States of America as represented by the Secretary of the Navy, Washington, D.C.

[21] Appl. No.: 519,064

[22] Filed: May 4, 1990

[51] Int. Cl.⁵ ............................. G01J 5/20; G01J 3/28
[52] U.S. Cl. ................................. 250/338.4; 250/339; 250/370.06
[58] Field of Search ............... 250/370.06, 339, 338.4, 250/211 J; 357/30 B, 30 E

[56] References Cited

U.S. PATENT DOCUMENTS 3,478,214 11/1969 Dillman ........................ 250/211 J
4,442,446 4/1984 Bouley et al. .................. 357/30
4,626,322 12/1986 Switzer ........................... 204/2.1
4,948,976 8/1990 Baliga et al. ................. 250/370.06

Primary Examiner—Carolyn E. Fields
Assistant Examiner—James E. Beyer
Attorney, Agent, or Firm—Kenneth E. Walden; Jacob Shuster

[57] ABSTRACT

Radiation absorbing layers of epitaxially grown, photovoltaic materials are deposited in stacked relation on a substrate in alignment with a coincident axis of input radiation impinging on a common optically active surface area of a detector device formed by the stacked layers. Semi-insulating layers space the radiation absorbing layers to electrically separate the signal outputs respectively produced in response to impinging radiation limited to separate and distinct wavelengths within a common spectral range as a result of the interrelationships between bandgap energy properties of the layer materials.

12 Claims, 1 Drawing Sheet

MULTI-COLOR COINCIDENT INFRARED DETECTOR

BACKGROUND OF THE INVENTION

This invention relates generally to radiation sensing detectors and more particularly to detectors producing plural electrical outputs in response to impinging radiation at distinctly different wavelengths.

The use of epitaxial semiconductors as infrared detectors in a multi-color imaging system, is generally well known. In such prior detector arrangements, photovoltages are developed across separate junctions respectively formed on the semiconductors having different bandgaps and on which separate optically active surfaces are established in order to achieve multi-color operation. Since each junction responds to only a spatial portion of the incident optical input, there is a loss of signal content. Further, when such detectors are arranged in an array configuration signal loss is especially severe because of non-coincident radiation focussed on separate areas at different times.

The use of two radiation absorbing layers of a photosensing device that are stacked in alignment with a common axis of coincident impinging radiation to respectively absorb different components of such radiation at different wavelengths, is disclosed in U.S. Pat. No. 4,651,001 to Harada et al. One of such layers is made of amorphous silicon according to the Harada et al. patent to sense only a visible wavelength component of input imaging light while the other radiation absorbing layer formed on a substrate is made of a photovoltaic platinum-silicon compound to absorb only an infrared component of light within a totally different spectral range. Obviously, the arrangement disclosed in the Harada et al. patent is incapable of, and not designed to, separately sense mutually exclusive components of radiation at different wavelengths within the same spectral range.

SUMMARY OF THE INVENTION

In accordance with the present invention, radiation absorbing layers are epitaxially grown in stacked relation on a substrate in alignment with a common axis of coincident input radiation impinging on an optically active surface area, all of such layers being made of photovoltaic materials having different bandgap energy properties that are so interrelated to effect radiation absorption at separate and distinct wavelengths within a common spectral range. The radiation absorbing layers are spaced from each other by semi-insulating layers to achieve electrical separation between radiation responsive signal outputs at the different wavelengths, through separate diode junctions respectively associated with the radiation absorbing layers in a heterojunction arrangement for multi-color signal processing operation.

BRIEF DESCRIPTION OF THE DRAWING FIGURES

Other objects, advantages and novel features of the invention will become apparent from the following detailed description of the invention when considered in conjunction with the accompanying drawing wherein.

DETAILED DESCRIPTION OF THE PREFERRED EMBODIMENT

Figure 1:
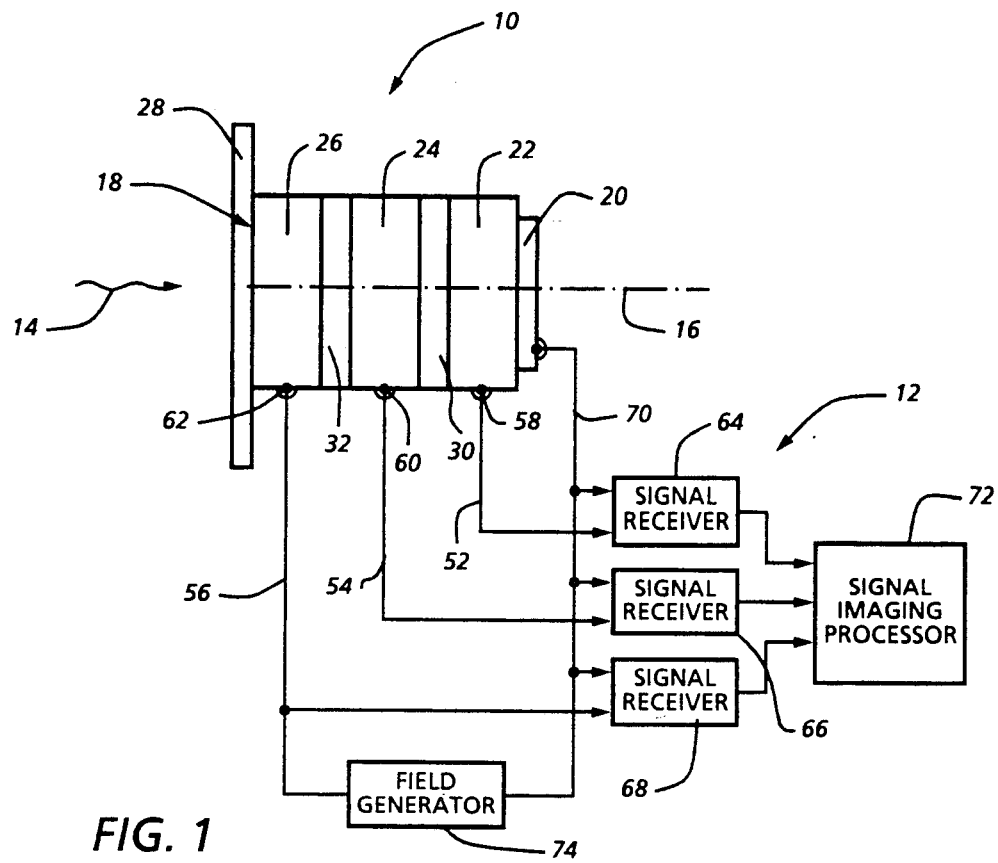
FIG. 1 is a side view of a heterojunction type of infrared detector device, in accordance with one embodiment of the present invention, together with a schematic block diagram of a signal processing system associated therewith.

Referring now to the drawing in detail, FIG. 1 depicts a heterojunction device, generally referred to by reference numeral 10, which may form part of a photodetector array operatively connected to a signal processing system 12, a portion of which is shown. A focussed beam of radiation 14 from some imaging system for example, is diagrammed in FIG. 1 in alignment with a coincident axis 16 for impingement on a common optically active surface 18 of device 10. In the illustrated embodiment, the surface 18 is centrally intersected by the axis 16.

The embodiment of device 10 illustrated in FIG. 1 includes three semiconductor layers 22, 24 and 26 stacked in alignment with axis 16 on a substrate 28. Each of the layers 22, 24 and 26 is made of a compatible photovoltaic material having interrelated, radiation absorbing properties arranged to separately absorb radiation at distinctly different wavelengths within a broad common spectral range, such as the infrared spectrum. The layers are furthermore spaced from each other by semi-insulating spacers 30 and 32 preferably made of layers of semiconductor material exhibiting bandgap energy levels higher than those of the radiation absorbing layers 22, 24 and 26 by 0.05 eV or more. The radiation absorbing layers furthermore exhibit bandgap energy levels decreasing in magnitude in a direction away from the substrate 28 on which the layer 26 is deposited. Accordingly, the layer 26 forms a wide bandgap region 34 as compared to a narrow bandgap region 36 and an intermediate bandgap region 38 as diagrammed in FIG. 2, said bandgap regions being respectively occupied by layers 22 and 24. A metal contact 20, is interfaced on the layer 22 furthermost from the substrate 28 as shown in FIG. 1.

Figure 2:
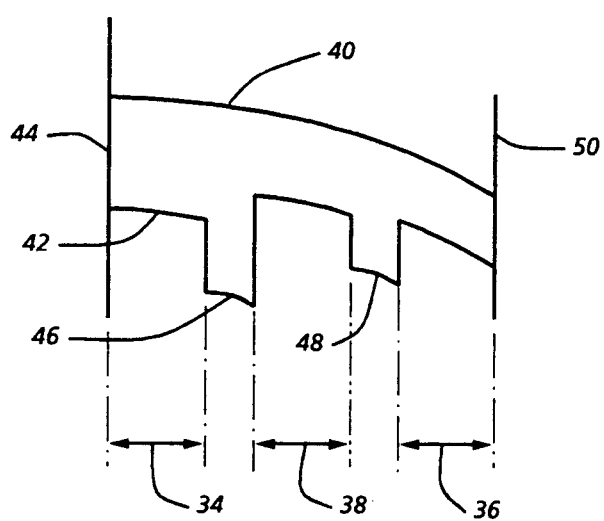
FIG. 2 is an energy band diagram for the detector device depicted in FIG. 1.

As shown in the energy band diagram of FIG. 2 corresponding to the device 10, the wide bandgap region 34 is defined between a conduction band edge 40 and a valence band edge 42 and extends from the interface 44 between substrate 28 and layer 26 to its interface with semi-insulating spacer 32 at which a rapid step-like increase in bandgap energy occurs to energy band region 46 establishing a higher bandgap energy region for the spacer 32 between the wide bandgap region 34 and the intermediate bandgap region 38 occupied by layer 24. Similarly, an increase in bandgap energy in energy band region 48 occurs between the intermediate and narrow bandgap regions 38 and 36, as diagrammed in FIG. 2. The narrow bandgap region 36 is terminated, as shown, at the interface 50 between layer 22 and the metal contact 20.

In view of the semi-insulating properties exhibited by the high bandgap spacers 30 and 32, the signal outputs extracted from the radiation absorbing layers 22, 24 and 26 are electrically separated. Thus, the signal outputs at respectively different wavelengths, corresponding for example to three different imaging colors, may be extracted by electrical leads 52, 54 and 56 from the layers 22, 24 and 26 through ohmic contact connectors 58, 60 and 62 to separate signal receivers 64, 66 and 68 as diagrammed in FIG. 1. The signal receivers are electrically connected in common through lead 70 to the diode junction establishing contact 20 of device 10 in order to supply individual and separated color signals to a multi-color signal imaging processor 72 of system 12. In order to facilitate better separation of radiation generated charge carriers producing the signal outputs from the radiation absorbing layers, the action of an electric field is utilized. Toward that end, a reverse bias between metal contact 20 and layer 26 is applied by means of field generator 74 as also diagrammed in FIG. 1.

The photovoltaic materials utilized for the semiconductor layers 22, 24 and 26 preferably belong to a class of lattice-matched groups, such as PbSe, PbSnSe and PbCdSe. Similar chalcogenides including in addition to the aforementioned selenides sulfides and tellurides may also be utilized. The semiconductor layers are deposited on each other as epitaxially grown crystals in stacked relation on the substrate by available hetero-epitaxy growth technology. Such method of construction was found to enhance performance in terms of the ability to discriminate between wavelengths of the same spectrum. Also, for proper performance band edge alignment is inherent in the detector arrangement described as evident from the energy band diagram of FIG. 2.

Figure 3:
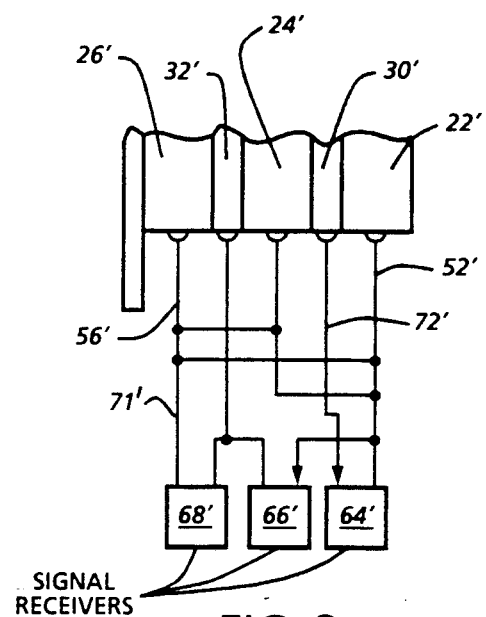
FIG. 3 is a partial side view of an alternative hetorojunction device in accordance with another embodiment of the invention.

The multi-wavelength signal output responses from the radiation absorbing layers may alternatively be obtained through plural p-n junctions, where corresponding radiation absorbing layers 22', 24', and 26' are all of one p or n type. In such case, the metal contact 20 is deleted in favor of contact connections to the semi-insulating spacers 30' and 32' of the other type (p or n), in order to establish diode junctions between different pairs of radiation absorbing layers and adjacent spacing layers through leads 52', 54', 56', 71' and 72' connected to signal receivers 64', 66 and 68' as shown in FIG. 3.

Numerous other modifications and variations of the present invention are possible in light of the foregoing teachings. It is therefore to be understood that within the scope of the appended claims the invention may be practiced otherwise than as specifically described.

What is claimed is:

1. An infrared detector comprising a first layer of semiconductor material responsive to infrared radiation at a first wavelength, a second layer of a different semiconductor material overlying said first layer and being responsive to infrared radiation at a second wavelength while transparent to infrared radiation at said first wavelength and contacts connected to each of said layers, said semiconductor material of one layer being lead telluride and said semiconductor material of the other layer being compatible photovoltaic material.

2. In a photodetector device having a plurality of successive semiconductor layers stacked in alignment with an optical axis along which radiation at different wavelengths is projected, said layers being respectively made of compatible photovoltaic materials having energy bandgaps progressively decreasing in magnitude in a direction in which said radiation is projected; the improvement residing in said bandgaps being interrelated to limit absorption of the radiation to a common spectral range and semi-insulating spacing means interfaced between the semiconductor layers for extracting electrically separated signal outputs in response to the absorption of the radiation by the respective layers at different wavelengths within said common spectral range.

3. The improvement as defined in claim 2 wherein said common spectral range is the infrared spectrum.

4. The improvement as defined in claim 2 including a diode junction contact interfaced with one of the semiconductor layers and ohmic contacts respectively positioned on each of the other semiconductor layers between the semi-insulating means.

5. The improvement as defined in claim 2 wherein said semi-insulating spacing means includes a plurality of spacers between said semiconductor layers made of material exhibiting an energy bandgap higher in magnitude than the bandgaps of the semiconductor layers.

6. In a device having a plurality of semiconductor layers stacked in alignment with an optical axis to respectively absorb impinging radiation at different wavelengths along said axis, all of said semiconductor layers being made of photovoltaic materials having energy bandgaps interrelated to limit absorption of the radiation to a common spectral range, semi-insulating spacing means interfaced between the semiconductor layers for electrical separation of signal outputs therefrom respectively corresponding to the different wavelengths and conductor means in contact with said semiconductor layers for extracting said electrically separated signal outputs in response to said absorption of the radiation at said different wavelengths within the common spectral range.

7. The improvement as defined in claim 6 wherein said photovoltaic materials are selected from latticematched groups consisting of chalcogenides of Pb, PbSn and PbCdSe.

8. The improvement as defined in claim 7 including a substrate on which said layers are stacked, said photovoltaic materials being epitaxial growths, respectively deposited on the substrate and the semi-insulating spacing means.

9. The photodetector as defined in claim 6 wherein said semi-insulating means includes a plurality of spacers between said semiconductor layers made of material exhibiting an energy bandgap higher in magnitude than bandgaps of the semiconductor layers.

10. The photodetector as defined in claim 9 wherein said photovoltaic materials are leads selenide compounds deposited on the substrate and the semi-insulating spacing means.

11. The improvement as defined in claim 6 including a substrate on which said layers are stacked, said photovoltaic materials being epitaxial growths, respectively deposited on the substrate and the semi-insulating spacing means.

12. In a photodetector device having a plurality of radiation absorbing layers stacked in alignment with a coincident axis, said layers being made of semiconductor materials exhibiting energy levels progressively decreasing along said axis, the improvement residing in detection of distinctly different wavelengths of impinging radiation within a common spectral range focussed on the device along said coincident axis, including heterojunction contact means connected to said layers for respectively extracting therefrom signal outputs at the different wavelengths in response to absorption of said impinging radiation and semi-insulating spacing means interfaced between the layers and exhibiting bandgap energy levels higher than those of the layers for electrically separating the signal outputs extracted therefrom.

* * * * *